United States Patent [19]

Yamamoto et al.

[11] Patent Number: 4,546,481

[45] Date of Patent: Oct. 8, 1985

[54] WINDOW STRUCTURE SEMICONDUCTOR LASER

[75] Inventors: Saburo Yamamoto, Nara; Hiroshi Hayashi, Kyoto; Seiki Yano, Kashihara, all of Japan

[73] Assignee: Sharp Kabushiki Kaisha, Osaka, Japan

[21] Appl. No.: 476,844

[22] Filed: Mar. 18, 1983

[30] Foreign Application Priority Data

May 28, 1982 [JP] Japan .................................. 57-91636
Jun. 23, 1982 [JP] Japan .................................. 57-108706

[51] Int. Cl.$^4$ ............................................. H01S 3/19
[52] U.S. Cl. ........................................ 372/48; 357/17; 372/46; 372/45
[58] Field of Search ...................... 372/44, 45, 46, 48; 357/17

[56] References Cited

FOREIGN PATENT DOCUMENTS 0138386 10/1979 Japan ...................................... 372/46
036184 4/1981 Japan ...................................... 372/46

OTHER PUBLICATIONS

Yamamoto et al.; Visible GaA AsV-Channeled Substrate Inner Strip Laser with Stabilized Mode Using p-GaAs Substrate, Dec. 7, 1981, pp. 372-374, Applied Physics Lett. 40(5), Mar. 1, 1982.

Hayakawa et al.; Highly Reliable and Mode Stabilized Operation in V-Channeled Substrate Inner Stripe Lasers on p-GaAs Substrate Emitting in the Visible Wavelength Region, Dec. 1981, pp. 443-446, Report from Int'l Electron Devices Meeting, Washington, D.C.

Hayakawa et al.; Highly Reliable and Mode-Stabilized Operation in V-Channeled Substrate Inner Stripe Lasers on p-GaAs Substrate Emitting in the Visible Wavelength Region; Nov. 1982; pp. 7224-7234, Journal of Applied Physics, vol. 53.

Primary Examiner—James W. Davie
Attorney, Agent, or Firm—Birch, Stewart, Kolasch & Birch

[57] ABSTRACT

A window V-channeled substrate inner stripe semiconductor laser which includes window regions formed at both ends of a stimulated region. The stimulated region includes a crescent active layer, and each of the window regions includes a plane active layer for transferring the laser beam emitted from the stimulated region to the mirror. The window regions ensure a stable operation of the laser oscillation and a high optical power for catastrophic optical damage.

7 Claims, 23 Drawing Figures

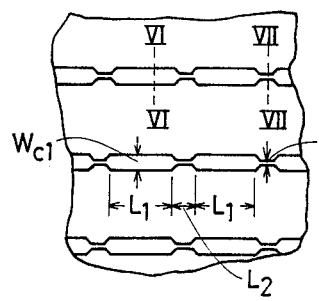
FIG. 5
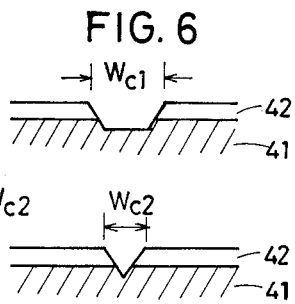
FIG. 6
FIG. 7
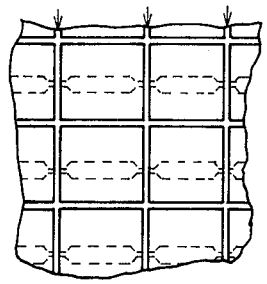
FIG. 8
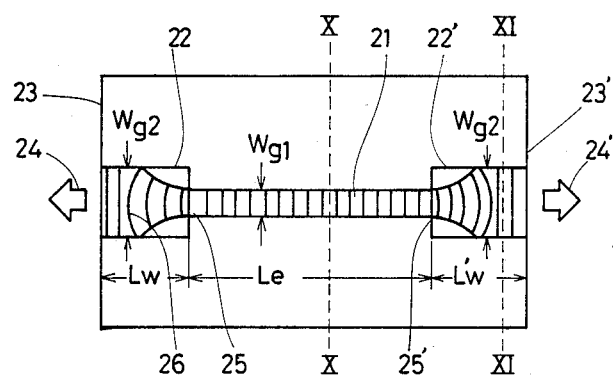
FIG. 9
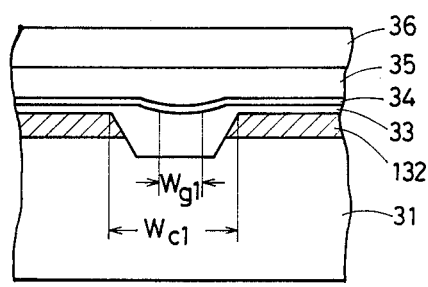
FIG. 10
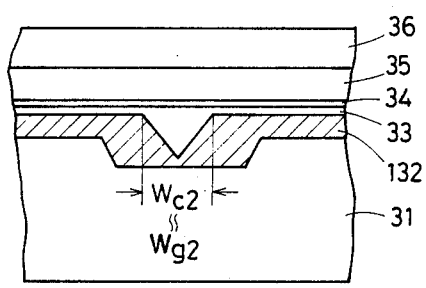
FIG. 11

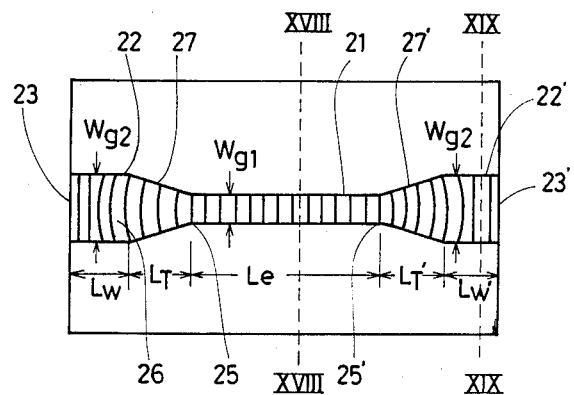
FIG. 17
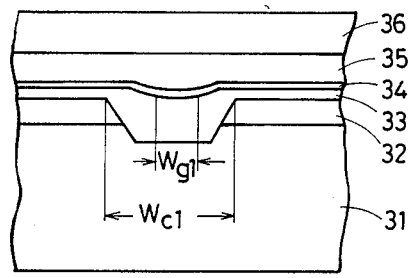
FIG. 18
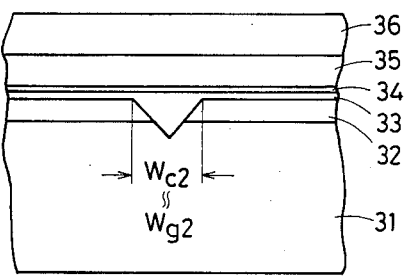
FIG. 19
FIG. 21
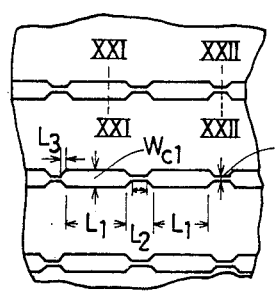
FIG. 20
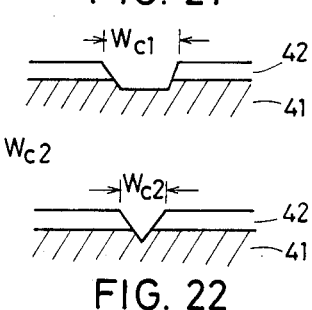
FIG. 22
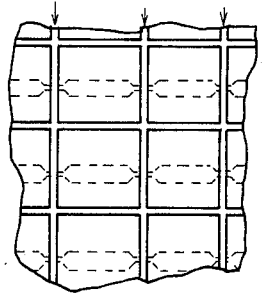
FIG. 23

WINDOW STRUCTURE SEMICONDUCTOR LASER

BACKGROUND AND SUMMARY OF THE INVENTION

The present invention relates to a semiconductor laser and, more particularly, to a laser device construction which ensures stable operation.

A semiconductor laser enjoys a limited period of life depending on deterioration of mirrors which function as the light emitting facet. Furthermore, a semiconductor laser may be damaged by way of the mirrors if the semiconductor laser is driven at a considerably high optical power. The maximum optical power for catastrophic optical damage (referred to as $P_{max}$ hereinafter) is about $10^6$ W/cm$^2$ in a conventional semiconductor laser.

It is desirable to increase the $P_{max}$ to achieve stable high power oscillation. Furthermore, the absorption of the high density laser beam near the mirrors must be reduced as low as possible in order to minimize the mirror deterioration.

To achieve the above effects, a window structure laser has been proposed in, for example, Appl. Phys. Lett. 15 May, 1979 P. 637. Another structure has also been proposed wherein a material is doped near the mirrors, the material having a wider band-gap energy than that of the active layer.

Generally, the conventional window structure semiconductor laser does not have the optical waveguide formed in the window region along the junction. Thus, the laser beam diffuses in the window region so as to reduce the beam amount directed to the stimulated region after reflection at the mirror. This will reduce the oscillation efficiency, and will increase the threshold current.

Accordingly, an object of the present invention is to increase the oscillation efficiency in a window structure semiconductor laser.

Another object of the present invention is to provide a semiconductor laser which stably emits the laser beam in the visible spectral range.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objects, pursuant to an embodiment of the present invention, an optical waveguide is formed in the window region, whereby the beam waists for the field confined along and perpendicular to the junction exist at the mirror. More specifically, a V-shaped groove is formed in the substrate. Both a crescent active layer and a plane active layer are formed in the stimulated region and the window region, respectively, through a liquid phase epitaxy method under the same condition. This construction is named the window V-channeled substrate inner stripe (referred to as VSIS hereinafter) laser.

The thus formed window region functions to suppress the higher transverse mode generated in the stimulated region so that only the fundamental transverse mode is transferred in the window region and developed through the mirror. The window VSIS laser of the present invention has low threshold current because the current is perfectly confined in the V channel by the inner stripe.

BRIEF DESCRIPTION OF THE DRAWINGS

The present invention will be better understood from the detailed description given hereinbelow and the accompanying drawings which are given by way of illustration only, and thus are not limitative of the present invention and wherein:

FIG. 5 is a schematic plan view showing a step of manufacturing the window structure semiconductor laser of FIG. 2;

FIG. 6 is a schematic sectional view of an essential part of the window structure semiconductor laser of FIG. 2 taken along line VI—VI of FIG. 5;

FIG. 7 is a schematic sectional view of an essential part of the window structure semiconductor laser of FIG. 2 taken along line VII—VII of FIG. 5;

FIG. 8 is a schematic plan view showing another step of manufacturing the window structure semiconductor laser of FIG. 2;

FIG. 9 is a schematic plan view showing wave fronts in another embodiment of a window structure semiconductor laser of the present invention;

FIG. 10 is a sectional view of the window structure semiconductor laser of FIG. 9 taken along line X—X of FIG. 9;

FIG. 11 is a sectional view of the window structure semiconductor laser of FIG. 9 taken along line XI—XI of FIG. 9;

FIG. 17 is a schematic plan view showing wave fronts in still another embodiment of a window structure semiconductor laser of the present invention;

FIG. 18 is a sectional view of the window structure semiconductor laser of FIG. 17 taken along line XVIII—XVIII of FIG. 17;

FIG. 19 is a sectional view of the window structure semiconductor laser of FIG. 17 taken along line XIX—XIX of FIG. 17;

FIG. 20 is a schematic plan view showing a step of manufacturing the window structure semiconductor laser of FIG. 17;

FIG. 21 is a schematic sectional view of an essential part of the window structure semiconductor laser of FIG. 17 taken along line XXI—XXI of FIG. 20;

FIG. 22 is a schematic sectional view of an essential part of the window structure semiconductor laser of FIG. 17 taken along line XXII—XXII of FIG. 20; and FIG. 23 is a schematic plan view showing another step of manufacturing the window structure semiconductor laser of FIG. 17.

DESCRIPTION OF THE PREFERRED EMBODIMENTS

Figure 1:
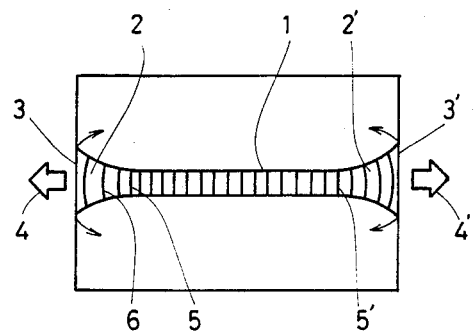
FIG. 1 is a schematic plan view showing wave fronts in the conventional window structure semiconductor laser.

In order to facilitate a better understanding of the invention, the conventional window structure semiconductor laser will be first described with reference to FIG. 1.

The window structure semiconductor laser generally includes a stripe shaped stimulated region 1, and a pair of window regions 2 and 2' formed at both ends of the stimulated region 1. Laser beams 4 and 4' are emitted through mirrors 3 and 3' which are positioned at the end of the window regions 2 and 2', respectively. The ends 5 and 5' of the stimulated region 1 are placed between the mirrors 3 and 3'. Wave fronts 6 represent the transmission of the laser beam in the window regions 2 and 2'.

In the above-mentioned conventional window structure semiconductor laser, the beam waist for the field confined along the junction exists at the ends 5 and 5' of the stimulated region 1. The beam waist for the field perpendicular to the junction, however, exists at the mirrors 3 and 3'. The thus created astigmatism provides problems when the laser is coupled with an optical system.

Figure 2:
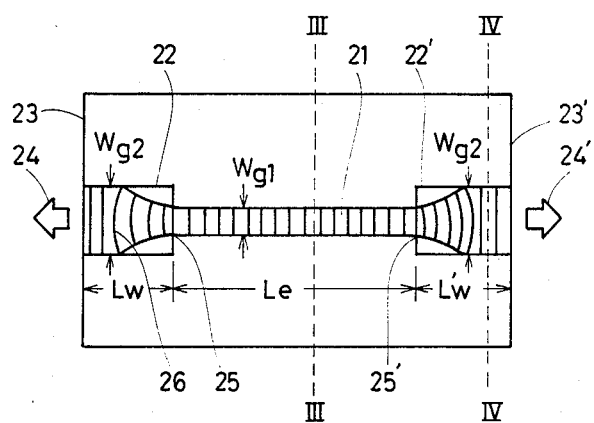
FIG. 2 is a schematic plan view showing wave fronts in an embodiment of a window structure semiconductor laser of the present invention.

FIG. 2 shows an embodiment of a window structure semiconductor laser of the present invention.

The window structure semiconductor laser of FIG. 2 includes a stimulated region 21, and a pair of window regions 22 and 22' formed at both ends of the stimulated region 21. The stimulated region 21 has a length $L_e$ and waveguide width $W_{g1}$. The window regions 22 and 22' have the waveguide width $W_{g2}$ and the length $L_w$ and $L_w'$, respectively. Laser beams 24 and 24' are emitted through mirrors 23 and 23' which are located at the ends of the window regions 22 and 22', respectively. The length $L_e$ of the stimulated region 21 is determined by the ends 25 and 25' which are positioned at both ends of the stimulated region 21. Wave fronts 26 depict the laser beam transmission in the window regions 22 and 22'.

Figure 3:
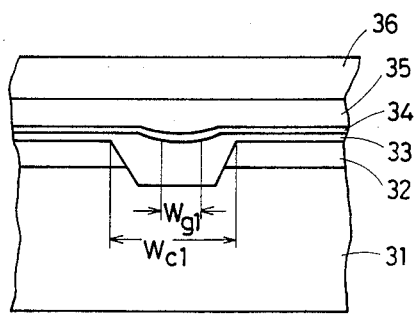
FIG. 3 is a sectional view of the window structure semiconductor laser of FIG. 2 taken along line III—III of FIG. 2.
Figure 4:
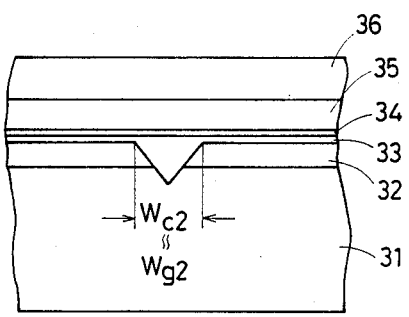
FIG. 4 is a sectional view of the window structure semiconductor laser of FIG. 2 taken along line IV—IV of FIG. 2.

FIG. 3 shows the construction of the stimulated region 21, and FIG. 4 shows the construction of the window regions 22 and 22'.

The window structure semiconductor laser of FIG. 2 includes a p-GaAs substrate 31, and an n-GaAs current blocking layer 32 formed on the p-GaAs substrate 31.

A V-shaped groove is formed in the current blocking layer 32 and the substrate 31. A p-GaAlAs cladding layer 33, a GaAs or GaAlAs active layer 34, an n-GaAlAs cladding layer 35, and an n-GaAs cap layer 36 are formed on the current blocking layer 32 as shown in FIGS. 3 and 4.

As shown in FIG. 3, the stimulated region has the same construction as the VSIS laser with a crescent active layer, and the window region has, as shown in FIG. 4, the same construction as the VSIS laser with a plane active layer. The VSIS laser is described in, for example, Transaction of Institute of Electronics and Communication Engineers of Japan, The Technical Group of Electron Devices (ED-81-42, 1981, P.31). That is, the VSIS laser is an inner stripe laser, wherein a groove is formed in a substrate so that light and current is confined in a current path.

More specifically, the current for laser oscillation is blocked by the n-GaAs current blocking layer 32, whereby the current flows only in the channel portion of the width $W_{c1}$ and $W_{c2}$. The channel is constructed to have the width which fulfills the relation $W_{c1} > W_{c2}$. When the active layer 34 is formed on the thus formed channel portions, the crescent active layer is formed at the channel portion of the width $W_{c1}$, and the plane active layer is formed at the channel portion of the width $W_{c2}$ under the same manufacturing condition. The crescent active layer functions to form an index guide of which width $W_{g1}$ is narrower than the channel width $W_{c1}$. The plane active layer functions to form a waveguide based on the reduction of the effective refractive index due to the light absorption by the n-GaAs current blocking layer 32 at the edges of the channel portion. The thus formed waveguide has the width $W_{g2}$ which is substantially identical with the channel width $W_{c2}$.

When the VSIS laser with a crescent active layer and the VSIS laser with a plane active layer are formed under the same condition, the VSIS laser with the crescent active layer generates the laser beam of the wavelength which is 100 through 200 Å longer than that of the laser beam generated by the VSIS laser with the plane active layer. That is, the VSIS laser with a crescent active layer has a narrower band-gap energy than the VSIS laser with a plane active layer by 21 through 42 meV. The VSIS laser with a crescent active layer has a low threshold current as compared with the VSIS laser with a plane active layer. However, the transverse mode is not stable in the VSIS laser with a crescent active layer. The VSIS laser with a plane active layer ensures a stable transverse mode although the threshold current is high as compared with the VSIS laser with a crescent active layer. Accordingly, if the waveguide having the above-mentioned two active layers is formed at the same time under the same condition, the laser oscillation occurs at the crescent portion and the plane active layer portion functions to transmit the laser beam. The present invention is based on the above-mentioned facts. In accordance with the present invention, the plane active layer is formed at both ends of the laser device having the crescent active layer, whereby the threshold current is reduced and the transverse mode is stabilized. The $P_{max}$ is increased and the mirror deterioration is minimized.

A method for manufacturing the window structure semiconductor laser of FIG. 2 will be described with reference to FIGS. 5 through 8.

First, Te-doped n-GaAs layer 42 ($n = 6 \times 10^{18}$ cm$^{-3}$) of 0.6 μm thickness is grown on a Zn-doped p-GaAs substrate 41 ($p = 1 \times 10^{19}$ cm$^{-3}$) through the use of a liquid phase epitaxial method. Then, a stripe shaped pattern is formed on the n-GaAs layer 42 as shown in FIG. 5 through the use of photolithography technique. A preferred resist is AZ1350 manufactured by Shipley Company. The pattern has alternatingly repeating wider windows of 150 μm length (L₁) and 6 μm width (W_{c1}), and narrower windows of 100 μm length (L₂) and 3 μm width (W_{c2}). Through the windows the GaAs layer 42 is etched through the use of a sulfuric acid system etchant. FIG. 6 shows an etched condition at the section VI—VI of FIG. 5, which corresponds to the stimulated region. FIG. 7 shows an etched condition of the section, VII—VII of FIG. 5, which corresponds to the window region.

Thereafter, the p-Ga$_{0.5}$Al$_{0.5}$As cladding layer 33, the p-Ga$_{0.85}$Al$_{0.15}$As active layer 34, the n-Ga$_{0.5}$Al$_{0.5}$As cladding layer 35, and the n-GaAs cap layer 36 are sequentially formed on the GaAs current blocking layer 32 (42) through the use of a liquid phase epitaxial method. The layers 33, 34, 35 and 36 have the thickness of 0.15 μm, 0.1 μm, 1.0 μm, and 2 μm, respectively, at the flat sections thereof. The active layer 34 has the thickness of 0.2 μm at the center of the crescent portion.

The rear surface of the substrate 31 is lapped so that the wafer thickness becomes 100 μm. Electrode layers are formed by evaporating Au-Ge-Ni on the n-GaAs cap layer 36 and Au-Zn on the lapped rear surface of the p-GaAs substrate 31, respectively. The thus formed electrode layers are alloyed at 450° C. Thereafter, Al is evaporated on the rear surface of the p-GaAs substrate 31, and the Al is patterned in accordance with the inner channels as shown in FIG. 8. The thus formed crystal is cleaved at the center of the window region, which has the length L₂, to obtain the total cavity length of 250 μm with the window regions of 50 μm length at the both ends thereof.

The above constructed window structure semiconductor laser of FIG. 2 exhibits the laser oscillation of the wavelength 7800 Å at $I_{th}$=30 mA. The $P_{max}$ is about 100 mW, and the stable fundamental transverse mode is obtained to 100 mW.

If the crystal is cleaved at the center of the stimulated region, the laser oscillation is conducted at the higher transverse mode, and the $P_{max}$ is about 10 mW. That is, in accordance with the present invention, the $P_{max}$ is increased to ten times.

In a preferred form, the mirror is coated by Al₂O₃. In this case, the $P_{max}$ is increased to 200 mW.

When the window structure semiconductor laser of the wavelength 8300 Å is manufactured in accordance with the present invention, the $P_{max}$ is 200 mW when the mirror coat is not provided, and the $P_{max}$ is 400 mW if the mirror coat is provided.

Both of the window structure semiconductor lasers of the wavelength 7800 Å and 8300 Å of the present invention enjoy stable continuous operation over 2500 hours under the output power 30 mW at 50° C.

In the window structure semiconductor laser of FIG. 2, there is a possibility that the window regions 22 and 22' satisfy the laser oscillation condition when the optical power is about 20 mW because the same current flows through the window regions 22 and 22' as the stimulated region 21. This will preclude the generation of the stable transverse mode.

FIG. 9 shows another embodiment of a window structure semiconductor laser of the present invention, wherein the current blocking layer in the window region is thicker than that in the stimulated region. Like elements corresponding to those of FIG. 2 are indicated by like numerals.

FIG. 10 shows the construction of the stimulated region 21, and FIG. 11 shows the construction of the window regions 22 and 23 of the window structure semiconductor laser of FIG. 9. Like elements corresponding to those of FIGS. 3 and 4 are indicated by like numerals.

As shown in FIG. 11, a current blocking layer 132 exists even at the center of the channel of the window regions 22 and 22'. Accordingly, the laser oscillation does not occur in the window regions 22 and 22', and the window regions operate only as the windows for transferring the laser beam generated from the stimulated region 21. In the embodiment of FIG. 9, the laser oscillation with the stable transverse mode is observed up to the optical power of about 100 mW.

A method for fabricating the window structure semiconductor laser of FIG. 9 will be described with reference to FIGS. 12 through 16, wherein like elements corresponding to those of FIGS. 5 through 8 are indicated by like numerals.

Figure 12:
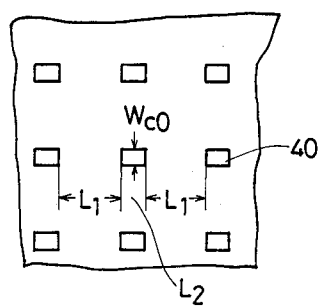
FIG. 12 is a schematic plan view showing a step of manufacturing the window structure semiconductor laser of FIG. 9.

First, a mask pattern having periodical rectangular windows 40 shown in FIG. 12 is formed on the Zn-doped p-GaAs substrate 41 (p=1×10¹⁹ cm⁻³) through the use of a photolithography method. The rectangular windows 40 have the width (W_{c0}) of 10 μm, and the length (L₂) of 100 μm. Each rectangular window is separated from the adjacent rectangular windows in a same line by the distance (L₁) of 150 μm. A preferred resist is AZ1350 manufactured by Shipley Company. Through the thus formed rectangular windows 40, the GaAs substrate 41 is etched by a sulfuric acid system etchant to form rectangular grooves in the GaAs substrate 41 to the depth of 1 μm.

A Te-doped n-GaAs layer 142 (n=6×10¹⁸ cm⁻³) of 0.8 μm thickness is grown on the GaAs substrate 41 through the use of the liquid phase epitaxial method. The rectangular grooves formed in the GaAs substrate 41 are filled by the n-GaAs layer 142. That is, the n-GaAs layer 142 has the thickness of 1.8 μm at the rectangular groove portions.

Figure 13:
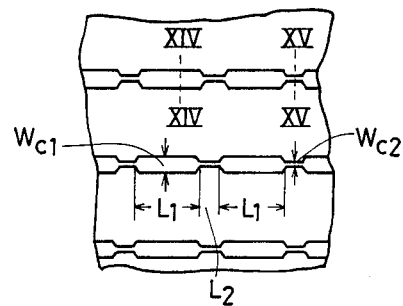
FIG. 13 is a schematic plan view showing another step of manufacturing the window structure semiconductor laser of FIG. 9.
Figure 14:
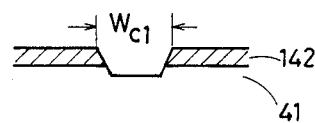
FIG. 14 is a schematic sectional view of an essential part of the window structure semiconductor laser of FIG. 9 taken along line XIV—XIV of FIG. 13.
Figure 15:
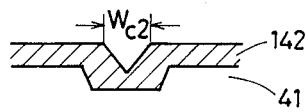
FIG. 15 is a schematic sectional view of an essential part of the window structure semiconductor laser of FIG. 9 taken along line XV—XV of FIG. 13.
Figure 16:
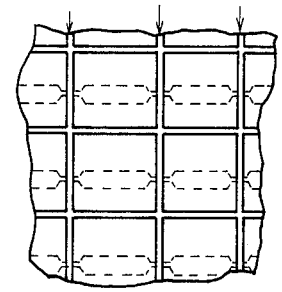
FIG. 16 is a schematic plan view showing still another step of manufacturing the window structure semiconductor laser of FIG. 9.

Then, the stripe shaped pattern is formed on the n-GaAs layer 142 as shown in FIG. 13 in a same manner as the pattern of FIG. 5. The narrower window sections correspond to the rectangular groove portions. Through the windows, the GaAs layer 142 is etched by a sulfuric acid system etchant. FIG. 14 shows an etched condition at the section XIV—XIV of FIG. 13, which corresponds to the stimulated region, and FIG. 15 shows an etched condition at the section XV—XV of FIG. 13, which corresponds to the window region. It will be clear from FIG. 15, at the window regions 22 and 22', the V-shaped etched portion is completely covered by the n-GaAs current blocking layer 142 (132).

The remaining layers 33, 34, 35 and 36, and the electrode layers are formed in a same manner as described with reference to FIGS. 3 through 8.

FIG. 17 shows still another embodiment of a window structure semiconductor laser of the present invention. Like elements corresponding to those of FIG. 2 are indicated by like numerals.

Tapered coupling regions 27 and 27' are disposed between the window region 22 and the stimulated region 21, and between the window region 22' and the stimulated region 21, respectively. The tapered regions 27 and 27' have the length $L_T$ and $L_T'$, respectively, and the waveguide width thereof linearlly increases to properly couple the waveguide in the stimulated region 21 (width $W_{g1}$) with the waveguide in the window regions 22 and 22' (width $W_{g2}$). The construction of the stimulated region 21 is shown in FIG. 18 which is identical with the construction shown in FIG. 3. The construction of the window regions 22 and 22' is shown in FIG. 19 which is identical with the construction shown in FIG. 4.

FIG. 20 shows a mask pattern formed on the n-GaAs layer 42. The pattern has alternatingly repeating wider windows of 150 μm length ($L_1$) and 6 μm width ($W_{c1}$), narrower windows of 100 μm length ($L_2$) and 3 μm width ($W_{c2}$), and tapered portions which has the length of 20 μm ($L_3$).

The remaining steps for manufacturing the window structure semiconductor laser of FIG. 17 are similar to those discussed with reference to FIGS. 3 through 8. FIG. 21 shows an etched condition at the wider windows, and FIG. 22 shows an etched condition at the narrower windows. FIG. 23 corresponds to FIG. 8. Detailed description related to FIGS. 21 through 23 is omitted for the purpose of simplicity.

The tapered coupling regions 27 and 27' prevent the reduction of the differential efficiency, and ensure the stable transverse mode even when the ambient temperature varies.

The present invention is applicable not only to the window structure semiconductor laser of the GaAlAs type but also to the various window structure semiconductor lasers of the hetero junction type such as the InP-InGaAsP type.

The invention being thus described, it will be obvious that the same may be varied in many ways. Such variations are not to be regarded as a departure from the spirit and scope of the invention, and all such modifications are intended to be included within the scope of the following claims.

What is claimed is:

1. In a window structure semiconductor laser configuration including a substrate, a current blocking layer, a cladding layer, and an active layer, said configuration comprising:
   a medial stimulated region which includes a crescent active layer; and
   window regions formed laterally at both ends of said stimulated region, each of said window regions including a plane active layer, said stimulated region defining a waveguide width which is narrower than a waveguide width determined by each of said window regions.

2. The window structure semiconductor laser of claim 1, further comprising:
   a pair of tapered coupling regions formed between said stimulated region and each of said window regions, each of said tapered coupling regions defining a waveguide width linearlly increasing from the waveguide width defined by said stimulated region to the waveguide width defined by each of said window regions.

3. In a window structure semiconductor laser comprising:
   a substrate;
   a current blocking layer formed on said substrate, said current blocking layer having a V-shaped groove formed therein, said V-shaped groove having a medial wider section and narrower sections disposed at both ends lateral to said wider section;
   a first cladding layer formed on said current blocking layer;
   an active layer formed on said cladding layer, said active layer having a crescent portion formed at a position corresponding to said wider section of said V-shaped groove formed in said current blocking layer, and plane portions formed at positions corresponding to said narrower sections of said V-shaped groove formed in said current blocking layer; and
   a second cladding layer formed on said active layer.

4. The window structure semiconductor laser of claim 3, wherein said current blocking layer is provided with thicker sections formed at the positions corresponding to said narrower sections of said V-shaped groove, whereby said cladding layer formed between said current blocking layer and said active layer is always separated from said substrate by said current blocking layer at said narrower sections of said V-shaped groove.

5. The window structure semiconductor laser of claim 3, wherein:
   said substrate comprises a p-GaAs substrate; said current blocking layer comprises an n-GaAs layer;
   said cladding layer comprises a p-GaAlAs layer; and
   said active layer comprises a GaAs layer.

6. The window structure semiconductor laser of claim 3, wherein:
   said substrate comprises a p-GaAs substrate; said current blocking layer comprises an n-GaAs layer;
   said cladding layer comprises a p-GaAlAs layer; and
   said active layer comprises a GaAlAs layer.

7. The window structure semiconductor laser of claim 3, wherein:
   said wider section of the V-shaped groove has a length of 150 μm; and
   each of said narrower sections of said V-shaped groove has a length of 50 μm.

* * * * *